(12) United States Patent
Okayasu

(10) Patent No.: US 6,433,567 B1
(45) Date of Patent: Aug. 13, 2002

(54) CMOS INTEGRATED CIRCUIT AND TIMING SIGNAL GENERATOR USING SAME

(75) Inventor: Toshiyuki Okayasu, Gunma (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/557,915

(22) Filed: Apr. 21, 2000

(30) Foreign Application Priority Data

Apr. 21, 1999 (JP) ........................................... 11-113380

(51) Int. Cl.[7] .............................. G01R 31/02; H05B 1/00
(52) U.S. Cl. ..................... 324/760; 324/158.1; 219/209
(58) Field of Search .............................. 324/760, 158.1, 324/537, 754; 219/209, 210, 497

(56) References Cited

U.S. PATENT DOCUMENTS

| | | | | |
|---|---|---|---|---|
| 4,165,642 A | * | 8/1979 | Lipp ........................... | 720/130 |
| 4,734,641 A | * | 3/1988 | Byrd, Jr. et al. .......... | 324/158.1 |
| 5,309,090 A | * | 5/1994 | Lipp ........................... | 324/158.1 |
| 5,414,370 A | * | 5/1995 | Hashinaga et al. ......... | 324/760 |
| 5,473,259 A | * | 12/1995 | Takeda ....................... | 324/760 |
| 5,886,564 A | * | 3/1999 | Sato et al. ................. | 324/158.1 |
| 5,911,897 A | * | 6/1999 | Hamilton .................... | 219/209 |

FOREIGN PATENT DOCUMENTS

JP    2001007297 A   *  1/2001   ........... H01L/27/04

* cited by examiner

*Primary Examiner*—Michael J. Sherry
*Assistant Examiner*—Jermele Hollington
(74) *Attorney, Agent, or Firm*—Muramatsu & Associates

(57) ABSTRACT

A CMOS integrated circuit to be used in a semiconductor test system for generating timing signals of high timing resolution and accuracy for testing semiconductor devices. The CMOS integrated circuit includes a heater circuit for generating heat based on electric current flowing there through, and a heater control circuit for detecting an amount of total electric current flowing through a timing generator block for generating timing signals, a control circuit block for providing timing data to the timing generator block, and the heater circuit and providing a control voltage to the heater circuit based on the amount of total current detected to control the current flowing through the heater circuit through a negative feedback loop.

7 Claims, 5 Drawing Sheets

CM OS INTEGRATED CIRCUIT AND TIMING SIGNAL GENERATOR USING SAME

FIELD OF THE INVENTION

This invention relates to a CMOS integrated circuit and a timing signal generator using the CMOS integrated circuit, and more particularly, to a CMOS integrated circuit and a timing signal generator using the CMOS integrated circuit to be used in a semiconductor test system for generating timing signals of high timing resolution and accuracy for testing semiconductor devices.

BACKGROUND OF THE INVENTION

In testing semiconductor devices such as ICs and LSIs by a semiconductor test system, such as an IC tester, a semiconductor IC device to be tested is provided with test signals or test patterns produced by a semiconductor test system at its appropriate pins at predetermined test timings. The semiconductor test system receives output signals from the IC device under test in response to the test signals. The output signals are sampled by strobe signals with predetermined timings to be compared with expected data to determine whether the IC device performs intended functions correctly.

An example of configuration in such a timing generator is shown in FIGS. 4–7. Typically, such a timing generator is configured in a CMOS integrated circuit. As shown in FIG. 4, an example of timing generator using CMOS integrated circuits is comprised of an electric power source 10, a control logic block 20, and a timing generator block 30. The electric power source 10 is a constant voltage source supplying electric currents to the timing generator block 30. In this example, a voltage source terminal VDD is connected to the ground (GND) and a voltage source terminal VSS is provided with a negative voltage.

The control logic block 20 is a logic circuit that produces timing data in synchronism with a clock signal for controlling delay times in variable delay circuits 31 in the timing generator block 30. The timing generator block 30 includes a plurality of variable delay circuits 31 to produce various timings in response to the timing data from the control logic block 20.

Typically, the timing generator block 30 is formed of a coarse delay circuit and a fine delay circuit such as shown in FIG. 7. For example, the coarse delay circuit produces a delay time which is an integer multiple of one clock signal period while the fine delay circuit produces a delay time which is a fraction of the one clock signal period. Thus, in this example, the variable delay circuit 31 of FIG. 4 corresponds to the combination of the coarse delay circuit and the fine delay circuit of FIG. 7.

The upper part of FIG. 7 is the coarse delay circuit and the lower part thereof is the fine delay control circuit. In the example of FIG. 7, the coarse delay circuit is formed of a counter 71, a register 72, a comparator 73, a flip-flop 74 and an AND gate 76. In the coarse delay circuit, the counter 71 is reset by a tester rate signal and the coarse delay data in the timing data from the control block 20 is loaded in the register 72. The counter 71 counts the clock signal. The counted data of the counter 71 is compared with the coarse delay data stored in the register 72 by the comparator 73.

When both data match with each other, the comparator 73 produces a coincidence signal which is re-timed by the flip-flop 74 and the AND gate 76. Thus, the output of the AND gate 76 shows a delay time which is an integer multiple of the clock cycle. The delayed output signal from the AND gate 76 is provided with a delay time which is smaller than the clock cycle by the fine delay circuit.

The fine delay circuit is configured by a plurality of variable delay circuits for producing weighted small delay times. In the example of FIG. 7, the fine delay control unit includes a delay unit 77 for generating a delay time equal to a ½ cycle of the clock signal and a delay unit 78 for generating a delay time equal to a ¼ cycle of the clock signal. The delay unit 77 is formed of AND gates 81 and 82, a delay element 83, and an OR gate 84. Similarly, the delay circuit 78 is formed of AND gates 85 and 86, a delay element 87, and an OR gate 88.

The delay elements 83 and 87 respectively produce the above noted delay times which are ½ cycle and ¼ cycle, respectively, of the clock signal. Such delay times are created by combinations of signal propagation delay times of many CMOS transistors or gates forming the delay elements 83 and 87. In other words, the timing generator of FIG. 4 and the timing generator block of FIG. 7 are typically formed of a CMOS integrated circuit, the delay elements 83 and 87 in the fine delay circuit operates in an analog fashion while the other parts thereof operate in a logic fashion.

As shown in the circuit configuration of FIG. 7, by the fine timing data provided to the AND gates, it is determine as to whether or not the input signal to the delay circuit is introduced to the signal path having the delay element for adding the delay time. As a consequence, at the output of the timing generator block of FIG. 7, a timing signal having a high timing resolution is produced. In an actual application to a semiconductor test system, a large number of such delay circuits are employed to produce a fine delay time having timing resolution of, for example, 1/32 cycle of the reference clock.

As noted above, each delay element is formed of a CMOS integrated circuit having a large number of CMOS transistors or CMOS gates series connected to one another. Accordingly, the delay time produced by such a delay element tends to be subject to voltage changes or temperature changes, resulting in the timing instability. For example, such temperature changes occur by the environmental changes or the heat dissipated or power consumption by the CMOS integrated circuit itself.

It is therefore necessary to remove the factors which cause fluctuations in the transmission delay time in the timing generator block 30 in order to obtain the high timing accuracy. The temperature variations in the CMOS integrated circuit chip caused by ambient temperature and/or the chip's self-generated heat as well as the source voltage variation account for the fluctuations in the delay timings in the timing generator block 30. The ambient temperature can be stabilized by using an improved cooling means such as a constant temperature chamber or oven. The source voltage can be stabilized by using a high-accuracy voltage regulator that senses the voltage supplied to the CMOS integrated circuit chip and regulate the same to be constant.

However, the temperature changes based on the self-dissipated heat by the CMOS integrated circuit is not easily removable. In a CMOS integrated circuit, electric current flows in an impulse manner during the transition period of each CMOS gate or transistor. In a steady state, after changing the states in the complementary MOS transistors, almost no electric current flows therein. Such transitions occur when a pulse signal propagating through the CMOS integrated circuit. Therefore, power consumption or heat dissipated by the CMOS integrated circuit is a function of the frequency or repetition rate of the pulse signal applied to the CMOS integrated circuit.

FIG. 5 shows the relationship between the signal repetition rate (frequency) in the CMOS integrated circuit and the heat dissipated (power consumed) by the CMOS integrated circuit. The repetition rate is the number of changes in the logic state per unit time when the CMOS integrated circuit is in operation. As indicated by the dotted line of FIG. 5, the self-dissipated heat by an ECL integrated circuit chip is constant regardless of the signal repetition rate. However, as indicated by the solid line of FIG. 5, the self-dissipated heat by the CMOS integrated circuit chip increases as the increase of the signal repetition rate.

Thus, the variation of the signal repetition rate in the CMOS integrated circuit results in the variation in the heat dissipation by the CMOS integrated circuit, which affects the chip temperature and transmission delay time. For example, as shown in FIG. 6, as the chip temperature of the CMOS integrated circuit increases, the transmission delay time increases as well.

Hence, the variation of the signal repetition rate of the CMOS integrated circuit leads to chip temperature variation, and varies the transmission delay time. As a result, timing drifts or timing jitters are involved at the timing signal output. In a semiconductor test system, in order to accommodate a variety of test specifications of semiconductor devices to be tested, test rates and timings of test signals to be generated must be freely adjustable.

For doing this, it is designed that output timings of the timing generator can be set freely for each test cycle. For example, a timing signal is output at the time period of 4ns for a certain test cycle while the time period of 1 μs for another test cycle. As a result, the repetition rate of the signal passing through the CMOS integrated circuit in the timing generator varies accordingly, resulting in the variation in the CMOS chip temperature.

To overcome this problem, an example of conventional technology includes a dummy delay circuit in the timing generator block 30 for each variable delay circuit 31. Based on the number of changes in the logic state shown in the timing data from the control logic block 20, the dummy delay circuit changes the state, thereby maintaining the constant overall signal repetition rate in the timing generator block in real time to a certain degree. However, since the signal repetition rate of the control logic block 20 is not constant, the temperature of the control logic block changes due to the variation of the operation frequency. The temperature change is transmitted to the timing generator block 30, resulting in the timing drifts or timing jitters in the output signal.

As explained in the foregoing, the variation of signal repetition rate in the CMOS integrated circuit in the timing generator causes timing drifts or timing jitters in the timing signal output. Thus, there is a need for a timing generator using CMOS integrated circuits having improved timing resolution and accuracy which is not affected by the changes in the signal repetition rate therein.

SUMMARY OF THE INVENTION

Therefore, it is an object of the present invention to provide a CMOS integrated circuit for a timing generator used in a semiconductor test system which can minimize timing drifts or timing jitters of the timing signal output even when the signal repetition rate in the CMOS integrated circuit forming the timing generator changes.

It is another object of the present invention to provide a CMOS integrated circuit and a timing generator using the CMOS integrated circuit to be used in a semiconductor test system in which an overall power consumption is regulated to be constant without regard to the changes in the signal repetition rate in the CMOS integrated circuit.

In order to achieve the above object, the first aspect of the present invention is a CMOS integrated circuit which functions as a timing signal generator that maintains constant power consumption in the CMOS integrated circuit characterized as having a heater circuit for controlling an overall electric current flowing therethrough by a control voltage, and a heater control circuit for detecting an amount of overall electric current flowing through a timing generator block, a control circuit block, and the heater circuit and providing a control voltage to the heater circuit based on the amount of the overall electric current detected to control the current flowing through the heater circuit through a negative feedback loop.

In the further aspect, the heater control circuit includes a current detection resistor for detecting the overall electric current, a differential amplifier provided with a voltage across the current detection resistor at its one input, and a reference voltage at its another input. The CMOS integrated circuit further includes a voltage regulator for controlling source voltages to the CMOS integrated circuit to be a constant value by monitoring at least one of the source voltages.

According to the present invention, even when the signal repetition rate in the CMOS integrated circuit varies, the source voltages VDD and VSS provided to the CMOS chip are controlled to be constant and the electric current ISS is also controlled to be constant. Because the power consumption of CMOS chip as a whole remains unchanged and the temperature of the chip also remains constant, the transmission delay time in the CMOS circuit is constant even when the signal repetition rate changes. Hence, no timing rifts or timing jitters will be involved at the timing signal outputs, thereby achieving high timing accuracy.

DETAILED DESCRIPTION OF THE PREFERRED EMBODIMENTS

Figure 1:
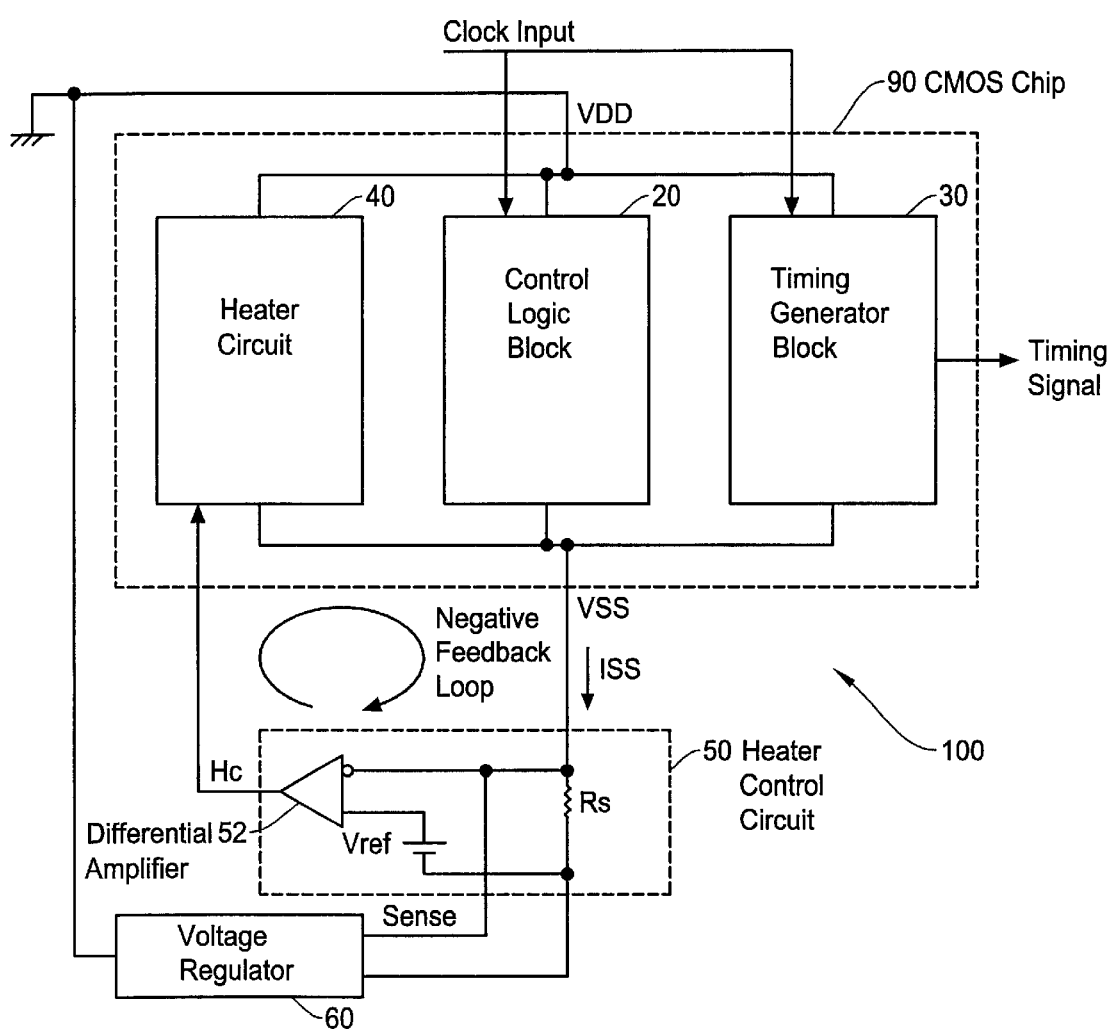
FIG. 1 is a schematic block diagram of the CMOS integrated circuit for generating timing signals in the present invention.
Figure 2:
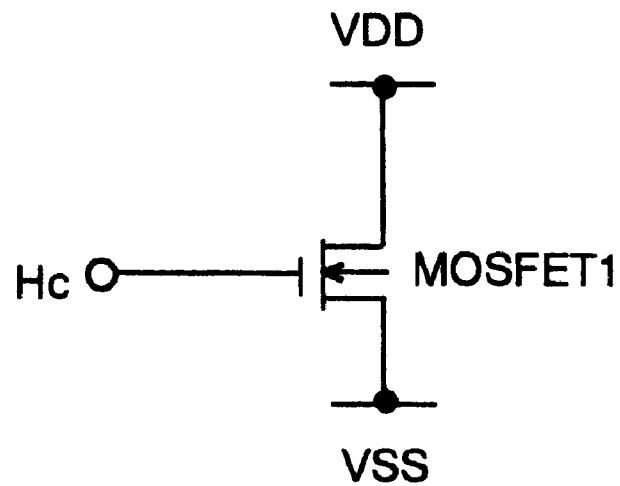
FIG. 2 is a basic circuit diagram showing an example of heater cell to be used in the heater circuit of FIG. 1.
Figure 3:
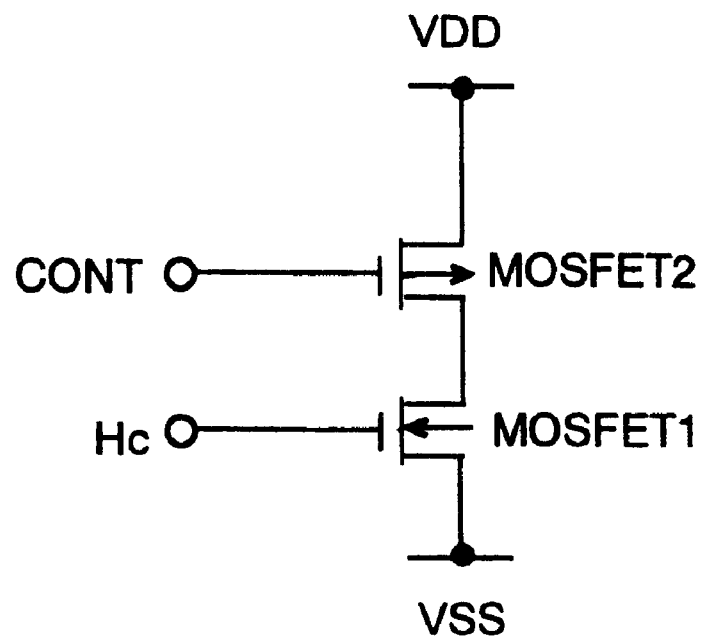
FIG. 3 is a schematic diagram showing another example of heater cell having an electric current cut-off control to be used in he heater circuit of FIG. 1.

FIGS. 1–3 show the CMOS integrated circuit for generating timing signals in the present invention. FIG. 1 shows a basic structure of the CMOS integrated circuit 100 for generating timing signals in accordance with the present invention. FIG. 2 shows an example of heater cell to be used in the heater circuit 40 in the CMOS integrated circuit 100 of FIG. 1. FIG. 3 shows another example of heater cell having an electric current cut-off control to be used in the heater circuit 40 in the CMOS integrated circuit 100.

Figure 4:
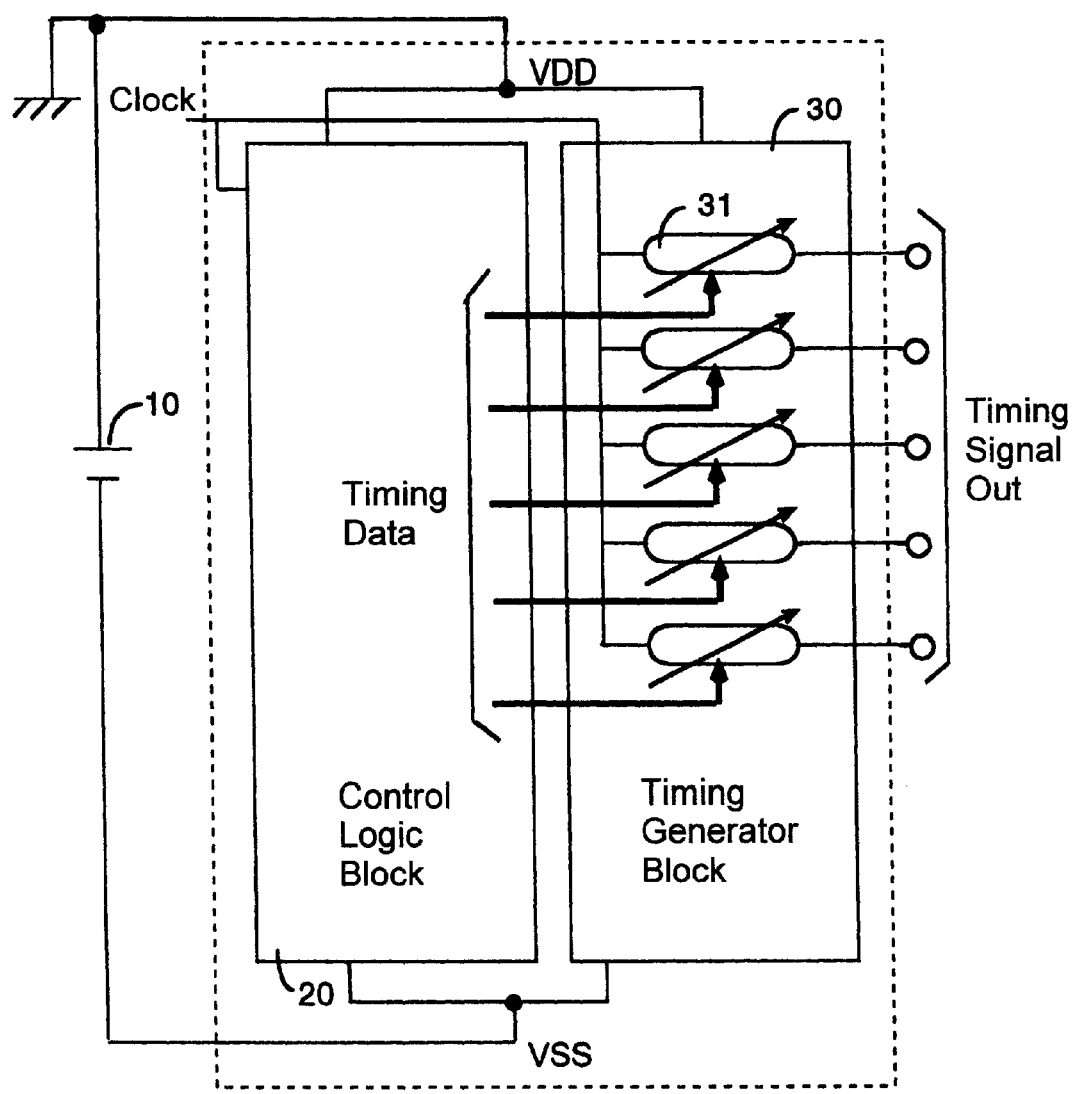
FIG. 4 is a block diagram showing an example of basic configuration in the CMOS integrated circuit in the conventional technology.
Figure 5:
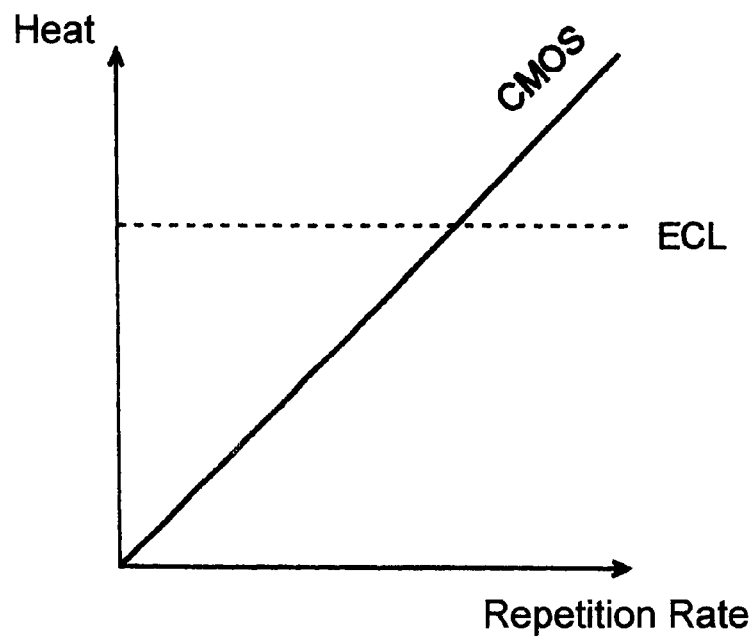
FIG. 5 is a graph showing the relationship between the signal repetition rate in integrated circuits and heat dissipated by the integrated circuits.
Figure 6:
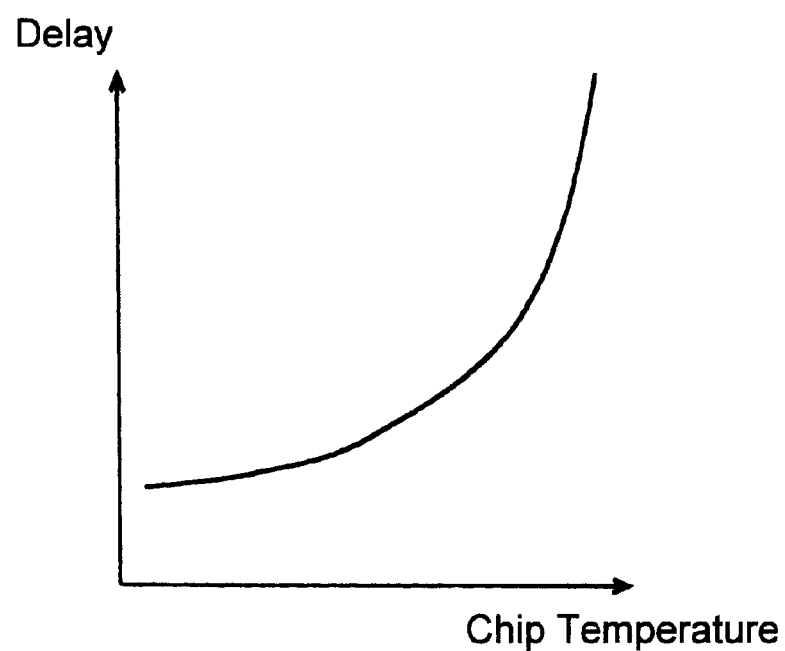
FIG. 6 is a graph showing the relationship between the chip temperature of the CMOS integrated circuit and the signal propagation delay time.
Figure 7:
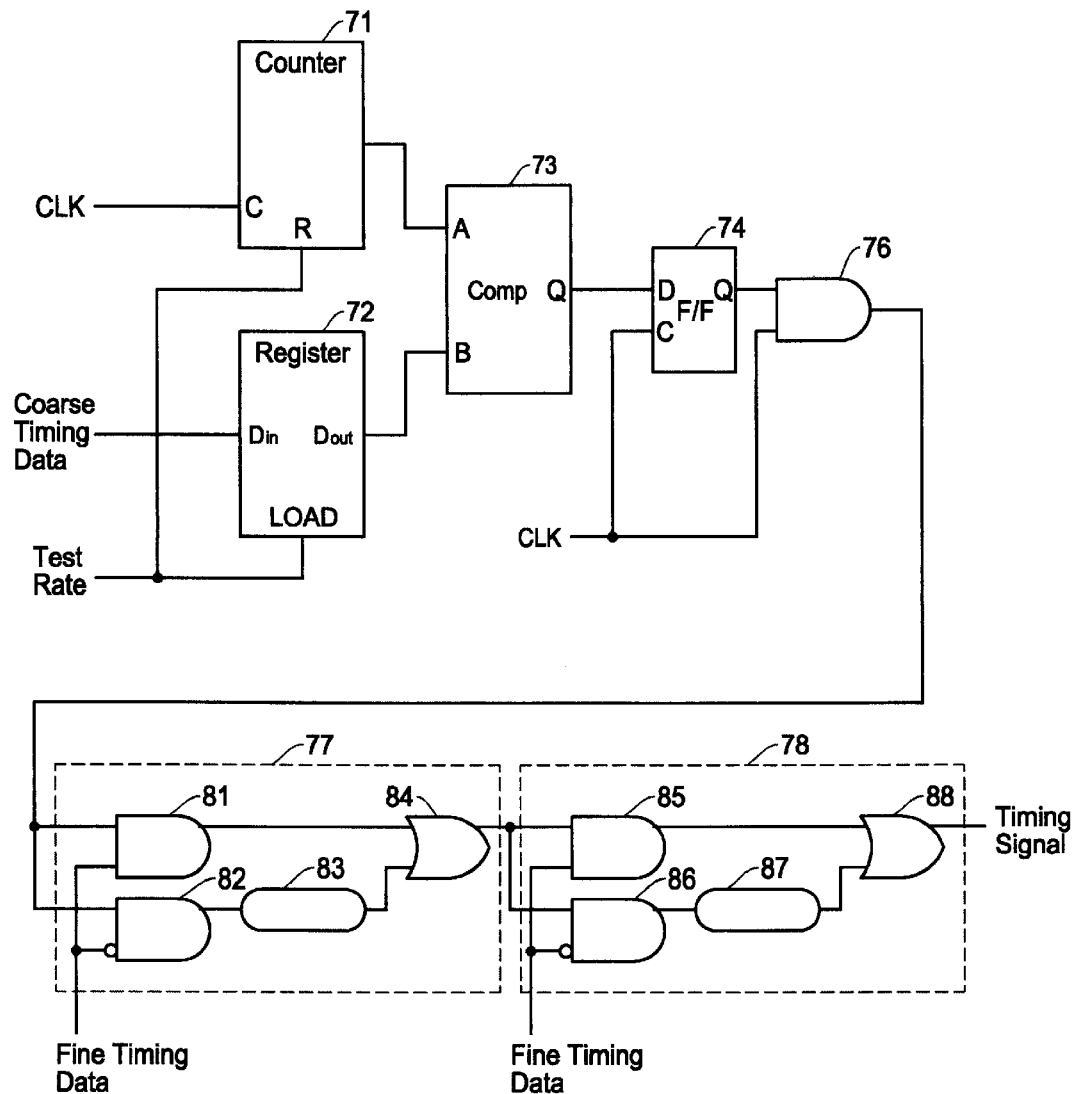
FIG. 7 is a block diagram showing an example of circuit configuration in the timing generator block in the conventional technology.

In the example of FIG. 1, the CMOS integrated circuit 100 for generating timing signals is comprised of a control logic block 20, a timing generator block 30, a heater circuit 40, a heater control circuit 50, and a voltage regulator 60. Preferably, the control logic block 20, timing generator block 30 and heater circuit 40 are commonly formed in a CMOS chip 90. In this configuration, the control circuit block 20 and the timing generator block 30 are identical to those in the conventional example of FIG. 4, thus, no further description about these blocks is given here.

The heater circuit 40 is to generate heat and is comprised of, for example, a plurality of N-type MOSFETs such as shown in FIG. 2 as heater cells (only one of them is shown). Each heater cell in the heater circuit 40 is arranged so as to be evenly distributed to the whole chip of the CMOS integrated circuit. The drain and source of the MOSFET1 of each heater cell are connected to source voltages VDD and VSS, respectively, and a control voltage Ha for the MOSFET1 from the heater control circuit 50 is supplied to the gate. The gate control voltage Ha controls the amount of current flowing through each heater cell in the heater circuit 40.

As shown in FIG. 1, the heater control circuit 50 is comprised of a resistor Rs with low resistance value, a reference voltage Vref, and a differential amplifier. The resistor Rs is to detect an overall current ISS which is a sum of currents flowing through the heater circuit 40, the control circuit block 20, and the timing generator block 30 by a voltage drop across the resister Rs. The voltage across the resistor Rs is supplied to one input of the differential amplifier while the reference voltage Vref is supplied to the other input of the differential amplifier. The heater control circuit 50 forms a negative feedback loop as shown by an arrow in FIG. 1 to control the current ISS to be constant by supplying a heater control voltage Hc to the heater circuit 40. The following equation is obtained by this negative feedback control.

$$ISS \times Rs = Vref \quad (1)$$

In the arrangement of FIG. 1, for example, when the signal repetition rate in the control logic block 20 and timing generator block 30 increases, the electric current ISS also increases. Then the heater control voltage Hc goes higher so that the current flowing through the heater circuit 40 decreases, thereby maintaining the overall current ISS constant. On the other hand, when the signal repetition rate in the control circuit block 20 and the timing generator block 30 decreases, the source current ISS also decreases. Thus, heater control voltage Hc is lowered so that the current flowing through the heater circuit 40 increases, thereby maintaining the overall current ISS constant.

The voltage regulator 60 is a constant voltage source for supplying an electric source current to the CMOS integrated circuit. The voltage regulator 60 supplies a source voltage VSS to the CMOS integrated circuit. The source voltage is a negative voltage relative to the source voltage VDD which is a ground potential. The voltage regulator 60 detects (sense) the voltage VSS of the timing generator circuit, and controls the negative voltage VSS to be equal to the reference voltage Vref of the voltage source regulator 60.

Thus, even when the signal repetition rate in the CMOS integrated circuit changes, the source voltages VDD and VSS provided to the CMOS integrated circuit chip and the overall current ISS are controlled to be constant. Hence, the power consumption by the overall chip becomes constant, thereby maintaining the chip temperature constant.

Since the chip temperature is regulated to be constant, the transmission delay time in the timing generator block 30 is not affected by the variation of the signal repetition rate in the CMOS integrated circuit. Therefore, timing signals of high accuracy can be generated because the timing drifts or timing jitters are not involved in the timing signals even when the signal repetition rate in the CMOS integrated circuit changes.

When a semiconductor device under test (DUT) is a CMOS integrated circuit, one of the test items for such DUTs is called an IDDQ test in which a quiescent source current of the DUT is measured. Since the timing signal generator of the present invention is implemented in a CMOS integrated circuit, it is preferable to test the CMOS integrated circuit by the IDDQ test. When performing the IDDQ test, the heater circuit 40 preferably is formed of heater cells each of which is comprised of an N-type MOSFET1 and a P-type MOSFET2 as shown in FIG. 3. The heater control circuit 50 provides the heater control voltage Hc to the gate of the N-type MOSFET1. The gate of the P-type MOSFET2 is provided with a control voltage CONT as a current cut-off threshold voltage. When the control voltage CONT equals to the source voltage VDD, an electric current to the heater cell is cut-off, and when the control voltage CONT equals to the source voltage VSS, the electric current flows through the heater cell in the heater circuit 40. Thus, in the case where the IDDQ test is performed, the control voltage CONT is set equal to the source voltage VDD so that the electric current flowing in the heater current 40 is shut down.

In the implementation described above, the heater cells of the heater circuit 40 are distributed evenly throughout the whole CMOS chip. However, the heater cells may be omitted in certain locations when sufficient temperature compensation is achieved by dummy delay circuits for the variable delay circuit 31. For example, the variation in the signal repetition rate can be compensated to a certain degree in real time by monitoring the number of output state changes in the control logic block shown in the timing data and the dummy delay circuits are driven in response to the number of output state changes. In other words, in such a situation, the heaters cell of the heater circuit 40 may be distributed only to the control logic block 20.

In the implementation described above, the heater circuit in FIGS. 2 and 3 is comprised of MOSFETs. However, the present invention is not limited to the use of MOSFETs, and other electric current control devices controlled by a control voltage may also be used.

Further in the implementation described above, all of the components of the present invention are configured within a CMOS integrated circuit. However, it is also possible that some components can be arranged outside of the CMOS integrated circuit, although a CMOS integrated circuit is used as a timing signal generator as a whole. For example, the voltage regulator 60 may be arranged outside of the CMOS integrated circuit, while the control logic block 20, the timing generator block 30, the heater circuit 40, and the heater control circuit 50 are arranged inside of the CMOS integrated circuit to compose the timing signal generator as a whole.

As another example, the heater control circuit 50 and the voltage regulator 60 may be arranged outside of the CMOS integrated circuit, while the control circuit block 20, the timing generator block 30, and the heater circuit 40 are arranged inside of the CMOS integrated circuit to compose the timing signal generator.

As has been explained in the forgoing, even when the signal repetition rate in the CMOS integrated circuit varies, the source voltages VDD and VSS provided to the CMOS chip are controlled to be constant and the electric current ISS is also controlled to be constant. Because the power consumption of CMOS chip as a whole remains unchanged and the temperature of the chip also remains constant, the transmission delay time in the CMOS circuit is constant even when the signal repetition rate changes. Hence, no timing drifts or timing jitters will be involved at the timing signal outputs, thereby achieving high timing accuracy.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A timing signal generator, comprising:

a timing generator block for producing timing signals of specified delay timings by adding the specified delay timings to input clock signals;

a control logic block for providing timing data specifying said delay timings to the timing generator block for controlling the delay timings of the timing signals;

a heater circuit for generating heat based on heater current flowing there through to raise temperature of said timing generator block;

a heater control circuit for detecting an amount of total electric current flowing through the timing generator block, the control logic block, and the heater circuit and providing a control voltage to the heater circuit based on the amount of total electric current detected to control the heater current flowing through the heater circuit through a negative feedback loop;

wherein the heater circuit, the timing generator block and the control logic block are provided within a common CMOS integrated circuit, thereby maintaining constant total electric current in the CMOS integrated circuit.

2. A timing signal generator as defined in claim 1, further comprising a voltage regulator for supplying a source voltage commonly to the timing generator block, the control logic block and the heater circuit and controlling the source voltage to be constant.

3. A timing signal generator as defined in claim 1, wherein the heater control circuit includes a current detection resistor for detecting said total electric current, a differential amplifier provided with a voltage across the current detection resistor at its one input, and a reference voltage at its another input.

4. A timing signal generator as defined in claim 1, wherein the heater circuit is comprised of a semiconductor circuit for controlling an amount of heater current flowing through the heater cells by a control signal.

5. A timing signal generator as defined in claim 1, wherein the heater current flowing through the heater circuit can be shut down by a semiconductor circuit which cuts off the heater current by application of a control signal.

6. A timing signal generator as defined in claim 4, wherein the semiconductor circuit is a MOSFET device.

7. A timing signal generator as defined in claim 5, wherein the semiconductor circuit for cutting-off the heater current is a MOSFET device.

* * * * *